(12) United States Patent
Dai et al.

(10) Patent No.: US 9,343,809 B2
(45) Date of Patent: May 17, 2016

(54) RF SYSTEM WITH INTEGRATED PHASE SHIFTERS USING DUAL MULTI-PHASE PHASE-LOCKED LOOPS

(71) Applicant: U.S. Army Research Laboratory ATTN: RDRL-LOC-I, Adelphi, MD (US)

(72) Inventors: Fa Foster Dai, Auburn, AL (US); Geoffrey Goldman, Ellicott City, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 576 days.

(21) Appl. No.: 13/767,892

(22) Filed: Feb. 15, 2013

(65) Prior Publication Data
US 2014/0232598 A1    Aug. 21, 2014

(51) Int. Cl.
*H01Q 3/34* (2006.01)
*H01Q 3/38* (2006.01)

(52) U.S. Cl.
CPC ... *H01Q 3/34* (2013.01); *H01Q 3/38* (2013.01)

(58) Field of Classification Search
CPC ........... G01S 3/46; H01Q 3/26; H01Q 3/2605
USPC ................... 342/25, 112, 194, 372, 442, 443
See application file for complete search history.

(56) References Cited

U.S. PATENT DOCUMENTS

| | | | |
|---|---|---|---|
| 4,642,649 A | * | 2/1987 | Lightfoot ................ 342/458 |
| 7,002,511 B1 | * | 2/2006 | Ammar et al. ............ 342/134 |
| 2006/0255999 A1 | * | 11/2006 | Egri et al. ................ 342/25 R |

OTHER PUBLICATIONS

Aniruddhan, S. "A CMOS 1.6 GHz Dual-Loop PLL With Fourth-Harmonic Mixing," IEEE Transactions on Circuits and Systems—I: Regular Papers, vol. 58, No. 5, p. 860 May 2011.

Zhong, Yu, et al. "Multi-loops Phase Locked System," IEEE ASIC,Proceedings, Fifth International Conference 5th vol. 2, pp. 736-739 (2003).Digital Object Identifier 10.1109/ICASIC.2003. 1277316.

Al-Araji, S., et al. "Adaptive Dual Loop Phase lock Loop with Improved Performance," IEEE New Circuits and Systems Conference (NEWCAS), 2011 IEEE 9th International Jun. 26-29, 2011.

* cited by examiner

*Primary Examiner* — Dao Phan
(74) *Attorney, Agent, or Firm* — Lawrence E. Anderson

(57) ABSTRACT

An RF system comprising of outputs to an electronically scanning antenna for radiating electromagnetic energy; at least one waveform generator; two multiphase phase-locked loops integrated with the waveform generator, the phase locked loops operating to provide multiple shifted phases to a waveform. Optionally, the two multiphase phase-locked loops may each be divided down by a bank of frequency dividers to further increase the number of phase shifts. The phases generated from each multiphase phase-locked loops are selected with multiplexers then mixed together. These upper or lower sidebands are then mixed with the up converted waveform which results in a phase shift for the waveform associated with each antenna element.

20 Claims, 4 Drawing Sheets

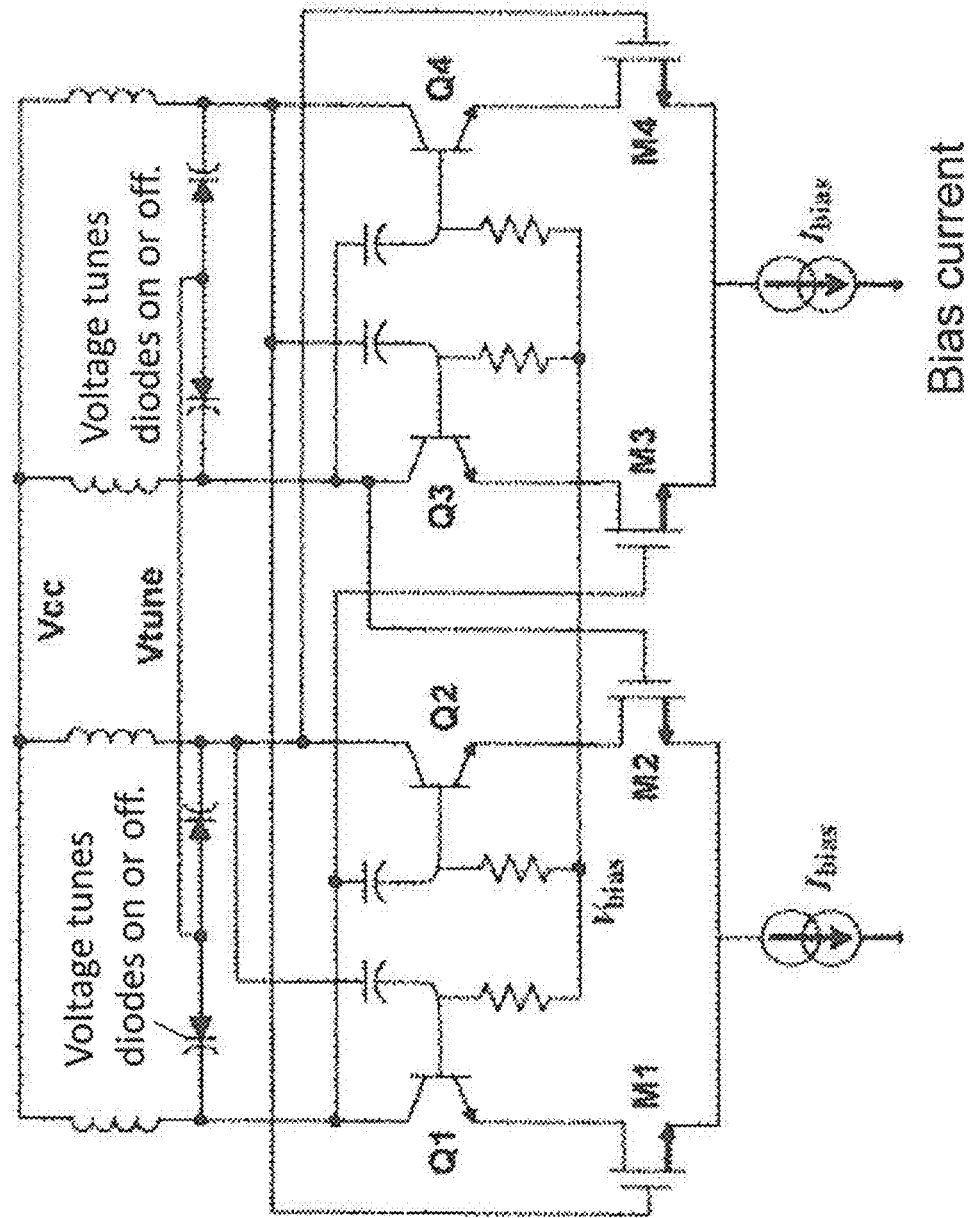
FIG. 4   QVCO circuit schematics using NPN (Q1, Q2, Q3, Q4) transistors for oscillation and NMOS (M1, M2, M3, M4) transistors for coupling.

RF SYSTEM WITH INTEGRATED PHASE SHIFTERS USING DUAL MULTI-PHASE PHASE-LOCKED LOOPS

STATEMENT OF GOVERNMENT INTEREST

The embodiments herein may be manufactured, used, and/or licensed by or for the United States Government without the payment of royalties thereon.

BACKGROUND OF THE INVENTION

Currently, state of the art RF systems that support phased array antennas use a non-integrated phase shifter. This results in power losses, while increasing weight, size, and cost. Advances have been made developing RF systems with integrated phase shifters. However, to support large phased array antennas, new techniques are needed to generate many precise phase shifts. Integrating the phase shifters with the RF transceiver will improve the performance and lower the cost these systems.

SUMMARY OF THE INVENTION

The present invention is directed to integrated radar architecture, such as a Wide Band Phased Array Antenna, wherein the RF phase shifters are integrated with the RF transmitter/receiver (TR) module. A novel multi-phase voltage controlled oscillator (VCO) generates the phase shifts that are integrated with the radar system. The phase shifts are generated in the narrow band, thus low phase noise, LC-based ring oscillator inside a phase locked loop, then selected through a multiplexer. To generate a larger number of phase shifts with wide bandwidth, the outputs of multiple multi-phase voltage controlled oscillator can be up- or down-converted using balanced image-rejection mixers. The accuracy and sensitivity of these phase shifters should be greater than traditional phase shifters based upon delay lines or ferroelectric devices. In addition, the architecture supports fast beam steering.

Although the invention is demonstrated with the application of this technique to radar applications, the sampling and reconstruction technique of the present invention also works with other communication systems, especially ones that employ ultra high-frequency modulation schemes.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 4 is a diagrammatic illustration of a serially coupled quadrature VCO (S-QVCO) circuit schematics using NPN for oscillation and NMOS for coupling.

DETAILED DESCRIPTION OF PREFERRED EMBODIMENTS

Figure 1:
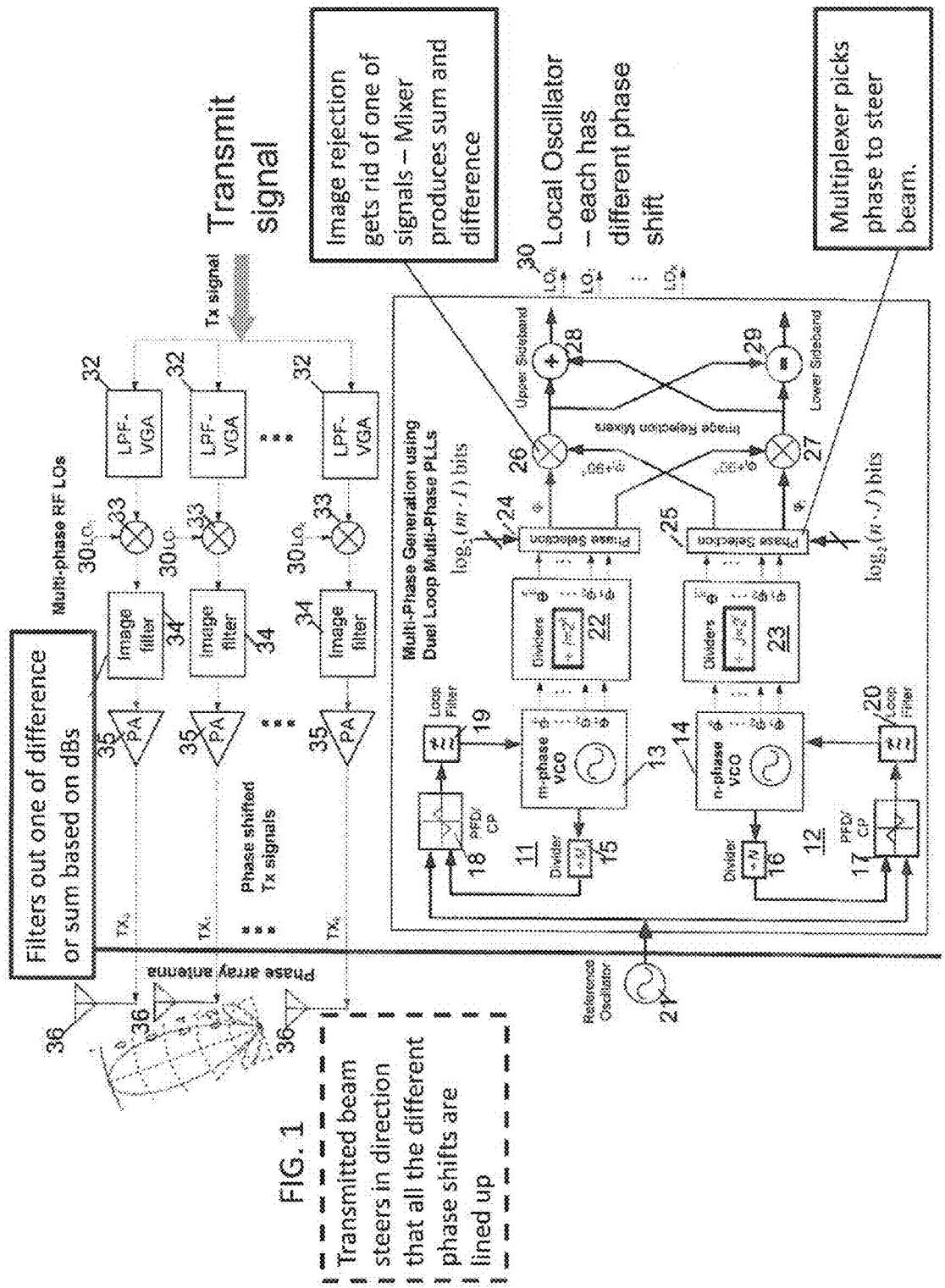
FIG. 1 is a diagrammatic illustration of the architecture of the preferred embodiment electronically scanning antenna with integrated phase shifter using dual loop multi-phase PLLs.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements in the frequency domain as illustrated in the Figures. The exemplary term "lower" or "upper", can therefore, encompass either "lower" or "upper," depending on the spectral relationship of the generated signals. Furthermore, the term "outer" may be used to refer to a surface and/or layer that are farthest away from a substrate.

Embodiments of the present invention are described herein with reference to cross-section illustrations that are schematic illustrations of idealized embodiments of the present invention. Embodiments of the present invention should not be construed as limited to the particular shapes of regions illustrated herein but are to include deviations in shapes that result, for example, from manufacturing. The regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A preferred embodiment of the present invention relates to architecture for an electronically scanning antenna (ESA) with integrated phase shifters with high gain, low cost, low power, compact size and reconfigurability. The architecture would be connected to an array of power amplifiers which drive each antenna element to form a phase array antenna. The antenna elements could be an array of patches, dipoles, horns, etc. The invention uses mixed signal processing technology to combine analog and digital components that traditionally are implemented separately. The phase shifters for the antenna are generated using a novel dual phase locked-loop (PLL) architecture with multi-phase voltage controlled oscillators (VCO), mixers and/or frequency dividers. This is implemented using a ring configuration of multiple LC-tuned VCOs. Phases are selected using high-speed multiplexers. FIG. 1 shows a block diagram of a realization of the proposed antenna system. The number of phase elements and operation frequency in FIG. 1 is for illustration purpose and can be generalized to any number of phase elements and frequency bands under the current invention. Configurations of the proposed phase array antenna architecture includes, but is not limited to, (1) multi-phase generation using a single loop PLL with a multi-phase VCO; (2) multi-phase generation using frequency dividers; (3) multi-phase generation using dual loop PLLs with multi-phase VCOs and image rejection mixers; (3) multiphase generation using dual loop PLLs with multi-phase VCOs and frequency dividers followed by image rejection mixers. An amplitude weighting can be added to each antenna element output with variable gain amplifiers on or off the chip.

FIG. 1 is an architecture of the proposed electronically scanning antenna with integrated phase shifter using dual loop multi-phase phase lock loops 11 and 12 as shown in FIG. 1. Each phase lock loop 11, 12 comprise a voltage controlled oscillator 13, 14. These multiphase voltage controlled oscillator create a local oscillation (LO) frequency that can be used to perform up- and down-conversions. The phase locked loops 11 and 12 operate to compare the phase and frequency of the divided VCO signal with the reference signal. When the loops are in lock, the VCO output frequency is M times the reference frequency, where M is the loop division ration, and its phase is locked with the reference phase. Also shown in FIG. 1 is a reference oscillator 21, which may for example comprise a crystal for generating a stable and low noise tone. The phase lock loops 11, 12 may thriller comprise dividers 15, 16, phase frequency detectors 17, 18, and loop filters 19, 20 which function in a well known manner.

In accordance with the principles of the present invention, the number of phase selections can be increased by inserting dividers 22, 23 between the VCO outputs and phase selection multiplexers 24, 25. Frequency dividers 22, 23 divide the VCO output frequency to lower frequency and meanwhile generate multiple phases at the divided frequency. For an m-phase VCO followed by dividers with divider ratio of $I=2^k$, the number of available phases after the dividers can be increased to m*I. The number of phase selections can be further increased by using both frequency dividers and mixers 26, 27. The total available phases can thus be increased as m*n*I*J. Note there may be redundant phases that can be covered by different combinations of m, n, I, J values. Nevertheless, the proposed multi-phase generation scheme can generate phase shifts with very line step size.

Figure 2:
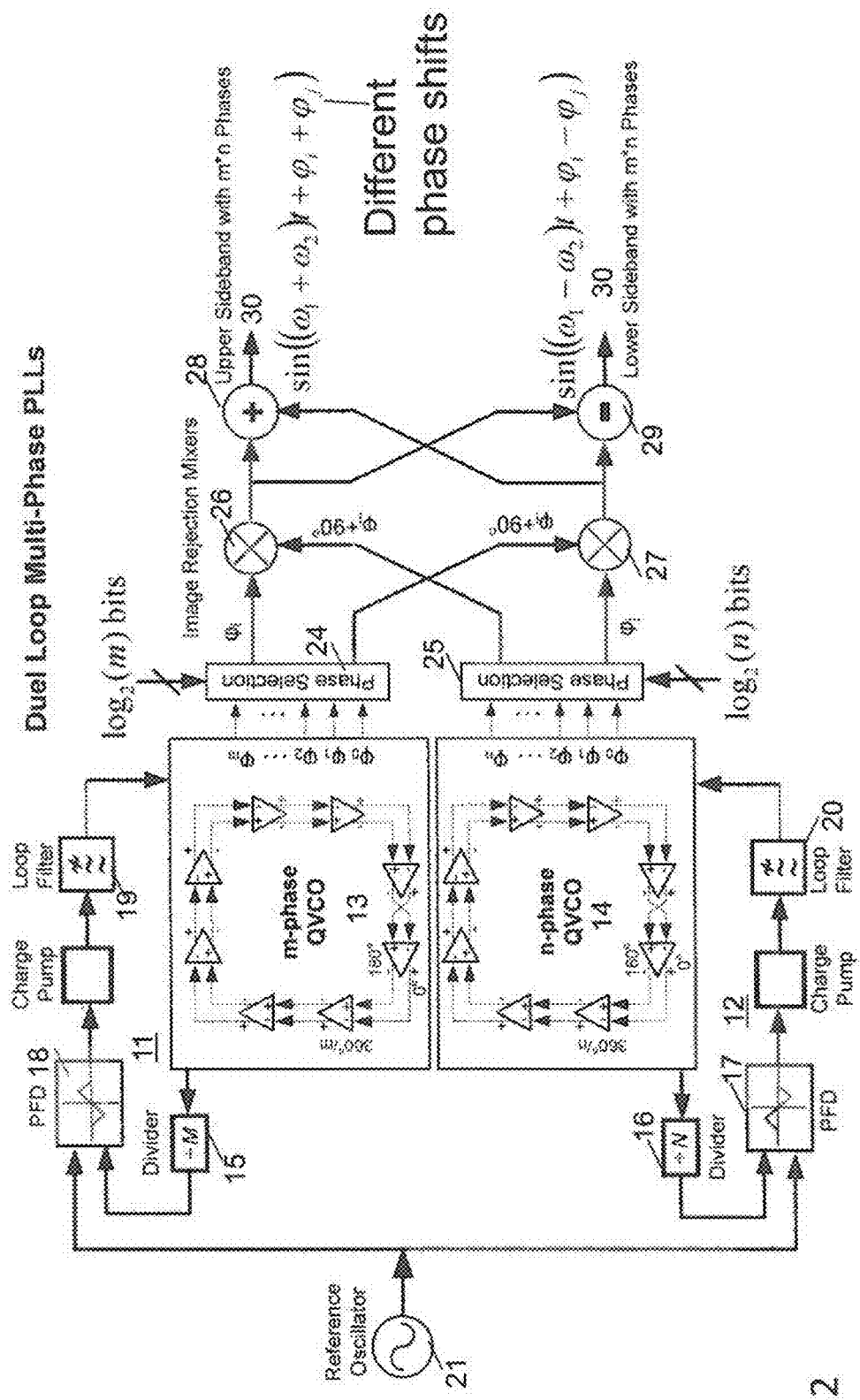
FIG. 2 is a schematic illustration of a multi-phase VCO based dual-loop phase locked loops with image rejection mixers for fine phase generation.

As shown in FIG. 1, the outputs of the voltage controlled oscillators 13, 14 are fed into frequency dividers 22 and 23, which divide signal in frequency by $2^k$. The outputs of frequency dividers 22 and 23 enter into phase selection multiplexers 24, 25. As shown in FIG. 1, an output of each phase selection multiplexers 24, 25 enters mixers 26 and 27, and the outputs of mixers 26 and 27 are inputted added and subtracted as shown in FIG. 1 to produce an upper and lower sidebands. The mixers 26 and 27 each produce the difference and sum of the signal inputted therein. Adder 28 and subtractor 29 operate to add and subtract the inputted signals to produce the sidebands as depicted in FIG. 2. The sidebands become the series of oscillator input signals 30 as shown in FIG. 1. Oscillator inputs are inputted into mixers 33. A transmission signal $T_x$, which could be produced by a waveform generator such as a direct digital synthesizer (DDS) (not shown) is inputted into a series of low pass filters-variable gain amplifiers 32 to remove the unwanted bands and to adjust its magnitude to the level that the following stage can handle. The output of the low pass filters-variable gain amplifiers 32 is inputted into the mixers 33, which up-converts the output of the low pass filters-variable gain amplifiers 32 to the desired carrier frequency bands. The mixer output 33 is fed into image filters 34 which filter out the unwanted image bands. Power amplifiers 35 further amplify the transmitting signals and output them into antenna elements 36.

To increase the number of available phase shifts, the outputs of two multi-phase quadrature VCOs (QVCOs) with M and N phase shifts inside the dual PLLs can be mixed to their upper and lower sidebands using image-rejection mixers. The number of phase shifts in the revised circuit shown in FIG. 2 is thus increased to M*N. Since the dual PLLs are driven by the same reference frequency, their outputs can be synchronized to the same reference with deterministic phase relationship. Mixing the outputs of two PLLs also provides more frequency selectivity with wideband tuning. This circuit can thus be used to support a large phased array antenna.

Figure 3:
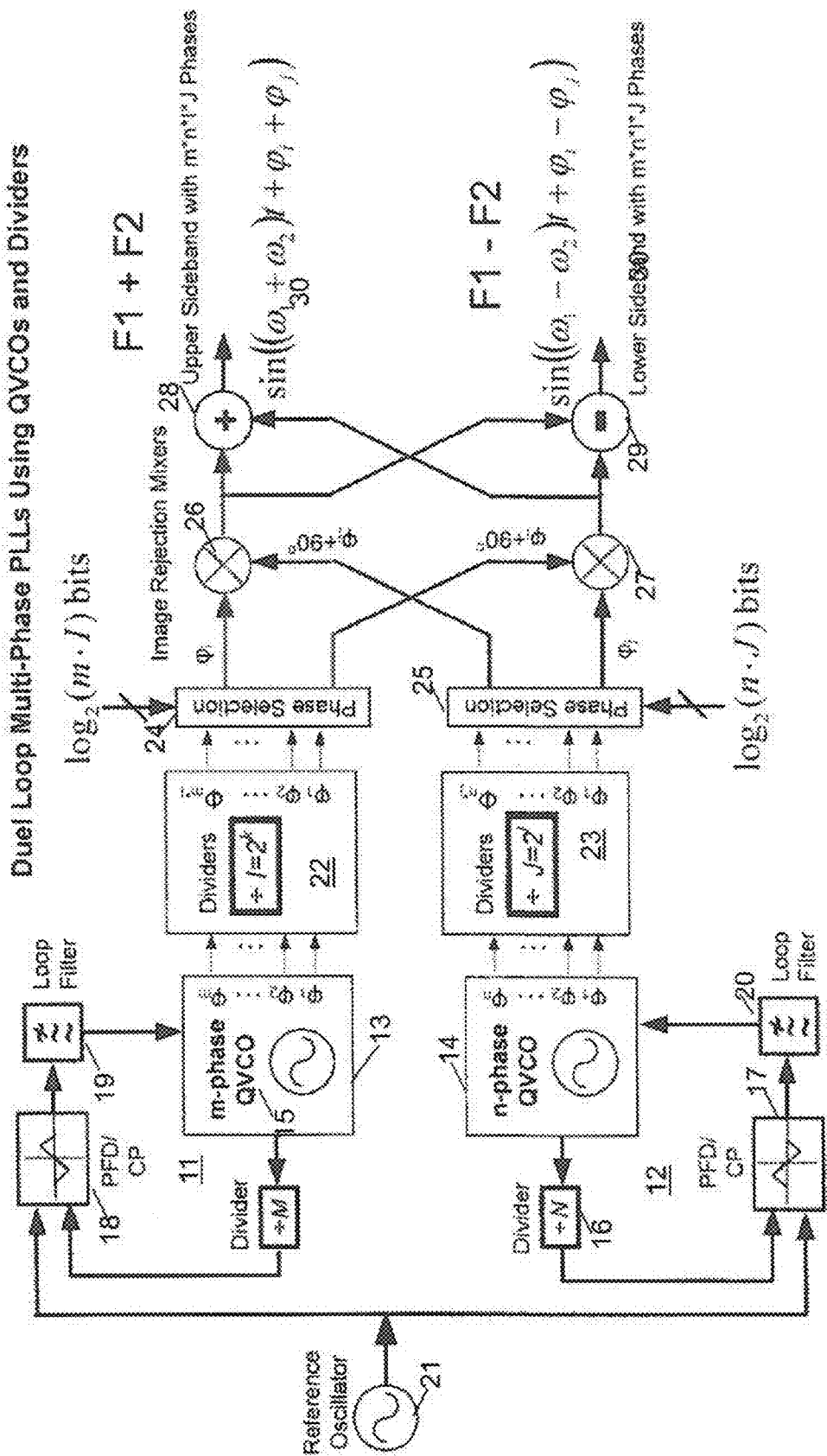
FIG. 3 is a multi-phase VCO based dual-loop phase locked loops with dividers and image rejection mixers for fine phase generation.

FIG. 3 is a schematic illustration of a multi-phase VCO based dual-loop phase locked loops with dividers and image rejection mixers for fine phase generation. As shown in FIG. 3, the number of phase selections can be further increased by inserting dividers between the multi-phase VCO outputs and the phase selection multiplexers. Frequency dividers divide the VCO output frequency to lower frequency and meanwhile multiple phases are available at the divided frequency. For instance, a divided-by-4 divider generates 4 phases (0°, 90°, 180°, 270°) through the division process. For an m-phase VCO followed by dividers with divider ratio of $I=2^k$, the number of available phases after the dividers can be increased to m*I theoretically. According to FIG. 3 using multi-phase VCOs and dividers, the total available phases become m*n*I*J. Note there may be redundant phases that can be covered by different combinations of m, n, I, J values. Nevertheless, the proposed multiphase generation scheme can generate phase shifts with very fine step size.

Configurations of the proposed phase array antenna architecture includes, but not limited to, (1) multi-phase generation using a single loop PLL with a multi-phase VCO; (2) multi-phase generation using frequency dividers; (3) multi-phase generation using dual loop PLLs with multi-phase VCOs and image rejection mixers; (3) multi-phase generation using dual loop PLLs with multi-phase VCOs and frequency dividers followed by image rejection mixers.

The advantages of the proposed phase-array architecture are low loss, low cost, low power, compact size, reconfigurability and most important environmental insensitive, compared to traditional antenna designs. The antenna architecture supports a wide frequency range for narrow band waveforms. The architecture also supports wider bandwidth waveforms such as chirps using intrapulse phase shifting techniques. ESA are typically implemented with discrete phase shifters that are large, expensive, and have several dB of loss. Phase shifters using integrated passive components are subject to large loss, large area and have limited bandwidth and tunability. The phase shifters based upon multi-phase VCOs are implemented on the same chip as other building blocks of the radar TR module such as the direct digital synthesizer, upconverters and power amplifiers, so there are no losses in transmit power due to connector or conductive losses and they are inexpensive. The multi-phase VCO is low power and low phase noise, and produces phase shifts that are locked to the input stable reference frequency and are thus stable against process, voltage and temperature (PVT) variations. The multi-phase can also be generated using an integrated high-frequency VCO followed by programmable frequency dividers. The outputs of the multi-phase VCO are selected with a multiplexer, and then mixed with the waveforms. The large number of phase shifts allows phase discrepancies in the amplifiers and variations in the delay-line lengths to be removed or reduced by digital calibration techniques.

Many applications require communicating between fixed nodes. Most antennas for communication systems do not have an ESA capability due to their large size and high cost. An ESA antenna will reduce power requirements and increase channel capacity compared to an omni-directional antenna. An ESA has faster switch times and is more reliable compared to mechanically scanning antennas. This invention will reduce the size, cost, weight, and power requirements for a high performance ESA. It eliminates the need for phase shifters on the ESA. Instead, the phase shifters are integrated onto a chip, which is a much simpler architecture. Third, this architecture supports narrow band waveforms operating over a large frequency range.

The problems which the invention solves (or intended application uses) include applications that require communicating between fixed nodes. Most antennas for communication systems do not have an ESA capability due to their large size and high cost. An ESA antenna will reduce power requirements and increase channel capacity compared to an omni-directional antenna. An ESA has faster switch times and is more reliable compared to mechanically scanning antennas. This invention will reduce the size, cost, weight, and power requirements for a high performance ESA. It eliminates the need for phase shifters on the ESA. Instead, the phase shifters are integrated onto a chip, which is a much simpler architecture. Third, this architecture supports narrow band waveforms operating over a large frequency range.

A preferred embodiment of the present invention can be used as an antenna for line of sight communication and radar systems. The antenna will improve performance in communication and radar systems by increasing the signal-to-noise ratio (SNR) and reduce interference from other sources.

The invention develops new techniques to combine analog and digital processing on a chip for designing an ESA; including a new circuit for a multi-phase VCO. Signal coupling between the VCO cores is critical for multi-phase VCO design. Taking a quadrature VCO (QVCO) as an example, there are various ways to couple the two VCOs and lock their output phases. The most common QVCO topology utilizes the parallel coupling. The parallel QVCO (P-QVCO) delivers quadrature signals with low phase and amplitude errors, yet it consumes large current to bias both the oscillation and coupling transistors. QVCOs can also be serially coupled by placing the coupling transistors in series with the oscillation transistors. By connecting the coupling transistors in series with current reuse topology, the serially coupled QVCO (S-QVCO) provides better isolation between the VCO outputs and its current sources, while the noise from the cascode devices has ignorable contribution. In the P-QVCO and S-QVCO reported so far, the same type of transistors has been used for oscillation and coupling. The new QVCO topology is a serially coupled LC-VCO using high-speed HBTs for oscillation and MOSFETs for coupling. As shown in FIG. 4, the oscillation NPN transistors Q1, Q2, Q3, and Q4 achieve high oscillation frequency and low phase noise, while the NMOS coupling transistors M1 through M4 allow more headroom, better isolation and increased tuning range. For the proposed S-QVCO circuit shown in FIG. 4, the NPN transistors Q1 and Q2 form a cross-coupled negative transconductance LC-tuned VCO and Q3 and Q4 form another identical LC-tuned VCO.

As shown in FIG. 4, the coupling between the two VCOs can be realized using four NMOS transistors M1, M2, M3 and M4. Thus, the proposed S-QVCO utilizes different types of transistors for oscillation and coupling. Compared to a P-QVCO, the S-QVCO achieves lower current consumption, since the coupling and oscillation transistors share the same bias current. In a P-QVCO, the coupling pair of transistors usually consumes an additional 30-40% of the core oscillator current for reasonable compromise between phase noise and phase error. In an S-QVCO, the coupling transistors are in series with the oscillation transistors. Additional bias currents are not required for biasing the coupling transistors, resulting in considerable power saving. Also, the coupling and oscillation transistors are connected in a cascode manner such that the noise coming from the coupling transistors and current sources are isolated from the LC-tank that is connected to the VCO outputs. The phase noise and phase error are relatively independent of each other in this topology. However, for the same voltage supply, the S-QVCO has less voltage headroom for output swing due to the insertion of the coupling transistors.

As is known NPN transistors can achieve higher oscillation frequency due to enhanced unit-power-gain-bandwidth-product, $f_{max}$, of the devices. On the other hand, MOS transistors have reduced voltage headroom requirements between the drain and source, and thus leads to relaxed bias scheme compared to their BJT counterparts. Since both types of transistors are available in a BiCMOS technology, one can combine the advantages of both types of transistors and achieve better QVCO performance. By using NPN transistors for oscillation, high oscillation frequency can be achieved. By using MOS transistors for coupling, higher output swing can be provided due to the reduced headroom required by the MOS transistors. The larger swing for the VCO output leads to lowered phase noise. In the proposed S-QVCO, the MOS coupling transistors are directly connected to the VCO output nodes, providing a much easier biasing scheme. This coupling scheme can be adopted to form not only a QVCO, but also a multi-phase VCO with multiple LC-based VCO cores.

Next, the outputs of multiple multi-phase voltage controlled oscillator were combined using image-rejection mixers as shown in FIG. 2 to increase the number of phase shifts. This architecture can be generalized to include two or more PLLs operate at the same or different output frequencies. As illustrated in FIG. 2, the dual loop PLLs are driven by the same reference source, thus their output frequencies are synchronized with deterministic phase relationship. Without losing the generality, one can assume the first PLL contains m-multiple output phases, while the $2^{nd}$ one has n-multiple output phases. The multi-phase VCOs used in this configuration can be implemented using the circuits similar to the quadrature VCOs (QVCO) discussed above. Thus, the outputs of two PLLs can be mixed using image rejection mixers (IRM). IRMs allow the single-side band mixing without unwanted spurs. The upper sideband mixer provides an output at $\sin((\omega_1+\omega_2)t+\phi_i+\phi_j)$, while the lower sideband mixer provides an output at $\sin((\omega_1-\omega_2)t+\phi_i-\phi_j)$. Both outputs have total m·n phase selections, which not only increases the phases available for phase array application, but also provide more frequency selections since the dual loops can be programmed to different output frequencies. Assuming the first loop can be programmed with M frequencies and the $2^{nd}$ one can be programmed with N frequencies, the resultant upper and lower sideband mixed outputs will have total 2M·N carrier frequencies available for channel programming. The proposed dual loop PLL configuration can be further generalized to include multiple PLLs with multi-phase VCOs to provide fine frequency and phase programming.

These circuits allow the removal of the phase shifters from an external device to a chip. In addition, having the phase shifters on a chip allows the antenna to switch beam positions in a clock cycle.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system comprising:
    transmitter circuitry adapted to be connected to an electronically scanning antenna for radiating electromagnetic energy at RF frequencies;
    at least one waveform generator;
    two multiphase phase-locked loops integrated with the waveform generator to provide tones with shifted phases to control the direction of the transmitted electromagnetic radiation.

2. The system of claim 1 wherein the transmitter circuitry, waveform generator and the at least two multiphase-locked loops are integrated on a single integrated circuit chip.

3. The system of claim 1 wherein the two multi-phase phase-locked loops have a reference signal input to which the multi-phase phase-locked loops are locked, and wherein each of the two multi-phase phase-locked loops comprise
    a voltage controlled oscillator which controls the output frequency dependent upon the inputted voltages,
    a feedback frequency divider that divides the voltage controlled oscillator output frequencies for the comparison with the reference frequency,
    a phase frequency detector that determines the difference in phase and/or frequency between the reference signal input and the feedback frequency divider output, and
    a loop filter that removes the high-frequency components of the phase frequency detector output for use as the control voltage signals for the VCO tuning.

4. The system of claim 3 wherein the loop filter is operatively connected to the phase frequency detector for filtering high-frequency components outside of a predetermined frequency band, the loop filter being operatively connected to the voltage controlled oscillator as its voltage control signal, the loop filter operating to control loop dynamics such as settling time, phase noise, and stability.

5. The system of claim 1 wherein the output of each multi-phase phase-locked loop is inputted into a second frequency divider, the second frequency divider operating to provide a plurality of frequencies; each of the outputs of the second frequency divider being inputted into first and second phase selectors, the outputs of the first and second phase selectors being inputted into first and second mixers, the outputs of the first and second mixers being subtracted from each other to form a lower sideband and added to form an upper sideband.

6. The system of 5 wherein the waveform generator outputs a first signal, and wherein the upper and lower sidebands are combined and inputted into third mixers, the third mixers operating to provide either the sum or difference between the combined signal and the first signal.

7. The system of claim 1 wherein each multiphase locked loop comprises a voltage controlled oscillator which controls the frequency, and wherein each voltage controlled oscillator comprises a plurality of LC-tuned VCO cores, each VCO core being coupled with other VCO cores using either active or passive devices connected in a cascaded ring oscillator configuration, forcing the voltage controlled oscillator to oscillate at different phases expressed by $2\pi/m$, where m is the number of VCO cores.

8. The system of claim 1 wherein the two multi-phase phase-locked loops comprise first and second voltage controlled oscillators, the first voltage controlled oscillator comprising M cores for creating M phase shifts and the second voltage controlled oscillator comprising N phase shifts, and wherein the M phase shifts and N phase shifts are mixed to further create upper and lower sidebands using image-rejection mixers.

9. The system of claim 8 wherein the number of phase shifts outputted is M*N.

10. The system of claim 9 wherein voltage controlled oscillators are driven by the same reference frequency and outputs of the voltage controlled oscillator are synchronized to the same reference with deterministic phase relationship.

11. The system of claim 10 further comprising phase selection multiplexers and frequency dividers wherein the number of phase selections is increased by inputting the outputs of the voltage controlled oscillators into the frequency dividers, the output of each frequency divider being inputted into first and second phase selection multiplexers; whereby the frequency dividers divide the voltage controlled oscillator output frequency to lower divided frequencies and generate multiple phases at the lower divided frequencies.

12. The system of claim 11 wherein the voltage controlled oscillators comprise an m-phase voltage controlled oscillator and an n-phase voltage oscillator, where m and n are integers, and wherein the frequency dividers have divider ratio of $I=2^k$, and whereby the number of available phases output by the frequency dividers is increased to m*I and n*I, respectively.

13. The system of claim 12 further comprising mixers and wherein there are two phase selection multiplexers have I and J number of phase selection inputs respectively, where I and J are integers, such that the number of phases outputted is increased to m*n*I*J.

14. A system for providing multiple-direction electromagnetic signals, the multiple directions being controlled by the phase of the signal, the system comprising:
   transmitter circuitry adapted to be connected to an electronically scanning antenna for radiating electromagnetic energy at RF frequencies;
   at least one waveform generator;
   two multi-phase phase-locked loops operatively connected to the waveform generator to provide tones with shifted phases to control the direction of the transmitted electromagnetic radiation.

15. The system of claim 14 wherein the two multi-phase phase-locked loops each comprise a multi-phase voltage controlled oscillator, each of the voltage controlled oscillators being operatively connected to a reference signal input, and a phase frequency detector.

16. The system of claim 15 wherein the outputs of the voltage controlled oscillator are inputted into frequency dividers, the output of the frequency dividers being inputted into phase selection multiplexers, the output of the phase selection multiplexers being inputted into first and second mixers, the outputs of the first and second mixers being subtracted from each other to form a lower sideband and added to form an upper sideband.

17. The system of claim 16 wherein the waveform generator outputs a first signal, and wherein the upper and lower sidebands are combined into a combined signal and inputted into third mixers, the third mixers operating to provide either the sum or difference between the combined signal and the first signal.

18. The system of claim 17 wherein the outputs of the third mixers are inputted into image filters which rejects either the sum or difference output of the third mixers, and wherein each of the image filters output a signal into a power amplifier which outputs a signal into an element in a phase array antenna, whereby the direction of the signal transmitted by the phase array antenna is controlled by the phase of each signal.

19. The system of claim 14 wherein each multiphase locked loop comprises a voltage controlled oscillator and each voltage controlled oscillator comprises a plurality of cores, each VCO core being coupled with other VCO cores using either active or passive devices connected in a cascaded ring oscillator configuration, whereby the voltage controlled oscillator oscillates at different phases that may be expressed by $2\pi/m$, where m is the number of VCO cores.

20. A system for transmitting multiple-direction electromagnetic signals, the multiple directions being controlled by the phase of the signal, the transmitting system comprising:
   transmitter circuitry adapted to be connected to an electronically scanning antenna for radiating electromagnetic energy at RF frequencies;
   at least one waveform generator;
   two multiphase phase-locked loops operatively connected to the waveform generator to provide tones with shifted phases to control the direction of the transmitted electromagnetic radiation.

* * * * *